(12) United States Patent  
Sugahara

(10) Patent No.: US 7,933,107 B2  
(45) Date of Patent: Apr. 26, 2011

(54) ELECTROSTATIC DISCHARGE PROTECTION CIRCUIT DEVICE

(75) Inventor: Takeshi Sugahara, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 556 days.

(21) Appl. No.: 11/986,472

(22) Filed: Nov. 21, 2007

(65) Prior Publication Data

US 2008/0180869 A1    Jul. 31, 2008

(30) Foreign Application Priority Data

Nov. 24, 2006    (JP) .................................. 2006-317519

(51) Int. Cl.
  *H02H 3/22*    (2006.01)
(52) U.S. Cl. ........................... 361/111; 361/56; 361/91.1
(58) Field of Classification Search .................... 361/56, 361/91.1, 111
  See application file for complete search history.

(56) References Cited

U.S. PATENT DOCUMENTS

| 5,043,782 | A | 8/1991 | Avery |
| 5,343,053 | A | 8/1994 | Avery |
| 5,400,202 | A * | 3/1995 | Metz et al. ...................... 361/56 |
| 5,548,135 | A | 8/1996 | Avery |
| 5,615,074 | A | 3/1997 | Avery |
| 6,765,771 | B2 * | 7/2004 | Ker et al. ......................... 361/56 |
| 2004/0207021 | A1 * | 10/2004 | Russ et al. ..................... 257/355 |
| 2005/0133869 | A1 * | 6/2005 | Ker et al. ...................... 257/355 |
| 2005/0264963 | A1 | 12/2005 | Sato |

FOREIGN PATENT DOCUMENTS

JP            2004-531055 A        10/2004

* cited by examiner

*Primary Examiner* — Stephen W Jackson  
*Assistant Examiner* — Tien Mai  
(74) *Attorney, Agent, or Firm* — Sprinkle IP Law Group

(57) ABSTRACT

An electrostatic discharge protection circuit device includes a discharge circuit, a trigger circuit and a trigger control circuit. The discharge circuit is connected to a predetermined circuit node of a semiconductor device, and makes discharge when surge voltage is applied to the circuit node. The trigger circuit triggers the discharge circuit to start a discharge operation by the discharge circuit. The trigger control circuit controls a trigger voltage at which the trigger circuit starts a discharge operation by the discharge circuit.

6 Claims, 5 Drawing Sheets

ELECTROSTATIC DISCHARGE PROTECTION CIRCUIT DEVICE

CROSS-REFERENCE TO RELATED APPLICATIONS

This application is based upon and claims the benefit of priority from prior Japanese Patent Application No. 2006-317519, filed Nov. 24, 2006, the entire contents of which are incorporated herein by reference.

BACKGROUND OF THE INVENTION

1. Field of the Invention

The present invention relates to an electrostatic discharge protection circuit device used for preventing an over-current due to, for example, a surge voltage from flowing into an internal circuit of a semiconductor device.

2. Description of the Related Art

A semiconductor device of a semiconductor integrated circuit is provided with an electrostatic discharge (ESD) protection circuit to protect the internal circuit from an over-current due to, for example, a surge voltage.

ESD protection circuits having various structures have been proposed, and the following structure is widely used. According to the structure, the internal circuit is protected using a diode or a MOS transistor. However, with high integration and low voltage of the semiconductor device, the internal circuit is not sufficiently protected even if the foregoing diode or MOS transistor are used. For example, PCT National Publication No. 2004-531055 discloses the following ESD protection circuit. The ESD protection circuit uses a silicon controlled rectifier (SCR) as a protection element. The SCR makes a switching operation at high speed, and a large current is carried through there. In addition, the SCR has strong durability with respect to breakdown. Thus, the ESD protection circuit using the SCR has excellent properties such as high performance and high protection ability. When a surge voltage is applied, the voltage at which the SCR turns on to start protecting the internal circuit from over-current is generally called the trigger voltage.

In the ESD protection circuit disclosed in the foregoing Publication, the trigger voltage is determined in the design stage. Thus, it is difficult to control the voltage after the ESD protection circuit is manufactured. Moreover, if the ESD protection circuit is used for a certain purpose, there is a need of making almost no protection operation of the ESD protection circuit. However, the ESD protection circuit disclosed in the foregoing Publication cannot effect the operation described above.

BRIEF SUMMARY OF THE INVENTION

According to a first aspect of the invention, there is provided an electrostatic discharge protection circuit device comprising:

a discharge circuit connected to a predetermined circuit node of a semiconductor device, and discharging the circuit node when surge voltage is applied to the circuit node;

a trigger circuit connected to the discharge circuit, and triggering the discharge circuit to start a discharge operation of the discharge circuit; and a trigger control circuit connected to the trigger circuit, and controlling a trigger voltage at which the trigger circuit starts the discharge operation of the discharge circuit.

According to a second aspect of the invention, there is provided an electrostatic discharge protection circuit device comprising:

a discharge circuit connected to a predetermined circuit node of a semiconductor device, discharging the circuit node when surge voltage is applied to the circuit node;

a trigger circuit connected to the discharge circuit, and triggering the discharge circuit to start a discharge operation of the discharge circuit, and further, having a fixed trigger voltage when the discharge circuit starts a discharge operation; and a discharge control circuit connected to the discharge circuit, and controlling a discharge start voltage at which the discharge circuit starts a discharge operation.

According to a third aspect of the invention, there is provided a programming circuit device for programming an irreversible change element, comprising:

at least one irreversible change circuit provided with an irreversible change element;

a circuit node connected to said at least one irreversible change circuit, and supplied with program voltage used for programming the irreversible change element; and an electrostatic discharge protection circuit connected to the circuit node, and discharging the circuit node when surge voltage is applied to the circuit node, and inhibiting an operation of discharging the circuit node when the program voltage is applied to the circuit node.

DETAILED DESCRIPTION OF THE INVENTION

Various embodiments of the present invention will be hereinafter described with reference to the accompanying drawings. The same reference numbers are used to designate common portions in all over the drawings.

First Embodiment

Figures 1, 2:
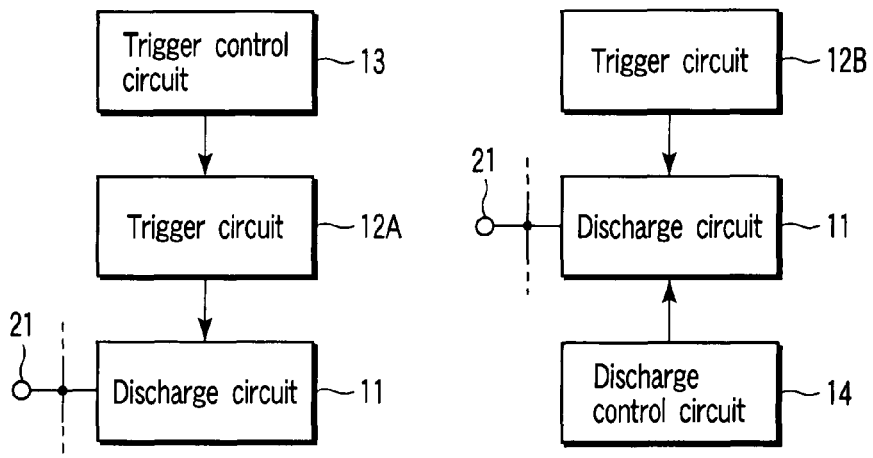
FIG. 1 is a block diagram showing the configuration of an ESD protection circuit device according to a first embodiment.
FIG. 2 is a block diagram showing the configuration of an ESD protection circuit device according to a second embodiment.

FIG. 1 is a block diagram showing the configuration of an ESD protection circuit device according to a first embodiment. The ESD protection circuit device of the first embodiment includes a discharge circuit 11, a trigger circuit 12A and a trigger control circuit 13. The discharge circuit 11 is connected to a circuit node 21 of a semiconductor device. The discharge circuit 11 effects a discharge when a surge voltage is applied to the circuit node 21. The trigger circuit 12A triggers the discharge circuit 11 to start a discharge operation of the discharge circuit 11. The trigger control circuit 13 controls the trigger voltage at which the discharge circuit 11 starts the discharge operation.

The ESD protection circuit device of the first embodiment has the foregoing configuration. In this way, the trigger control circuit 13 controls the trigger voltage at which the discharge circuit starts a discharge operation even if a semiconductor device is manufactured after the ESD protection circuit device is built therein. Moreover, the trigger control circuit 13 controls the trigger voltage so that the voltage becomes sufficiently large. By doing so, it is possible to make almost no discharge operation by the discharge circuit 11. In other words, it is possible to inhibit a protection operation as the ESD protection circuit device.

Second Embodiment

FIG. 2 is a block diagram showing the configuration of an ESD protection circuit device according to a second embodiment. The ESD protection circuit device of the second embodiment includes a discharge circuit 11, a trigger circuit 12B and a discharge control circuit 14. Like the first embodiment, the discharge circuit 11 is connected to a circuit node 21 of a semiconductor device. The discharge circuit 11 effects a discharge when a surge voltage is applied to the circuit node 21. The trigger circuit 12B triggers the discharge circuit 11 to start a discharge operation of the discharge circuit 11. The trigger circuit 12B of the second embodiment differs from that of the first embodiment in the following point. The trigger voltage at which the discharge circuit 11 starts a discharge operation is fixed. The discharge control circuit 14 controls a discharge start voltage at which the discharge circuit 11 starts a discharge operation.

The ESD protection circuit device of the second embodiment has the foregoing configuration. In this way, the discharge control circuit 14 controls the discharge start voltage at which the discharge circuit 11 actually starts a discharge operation after the trigger circuit 12B triggers the discharge circuit even if a semiconductor device is manufactured after the ESD protection circuit device is built therein. Moreover, the discharge control circuit 14 carries out control so that the discharge start voltage of the discharge circuit 11 becomes sufficiently large. By doing so, it is possible to inhibit a discharge operation of the discharge circuit 11. In other words, it is possible to inhibit a protection operation as the ESD protection circuit device.

First Example of the First Embodiment

Examples of the ESD protection circuit according to the first and second embodiments will be hereinafter described in detail.

Figure 3:
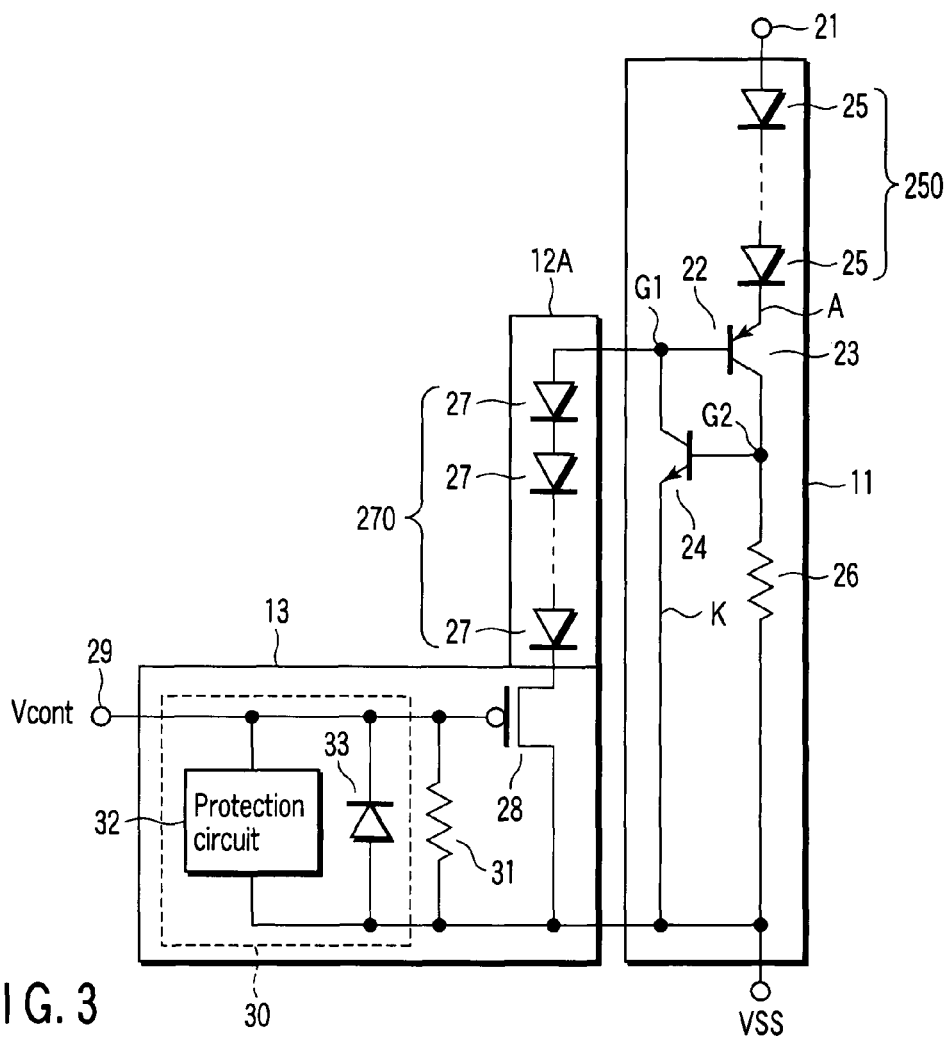
FIG. 3 is a circuit diagram showing an ESD protection circuit device according to a first example of the first embodiment.

FIG. 3 is a circuit diagram showing an ESD protection circuit device according to a first example of the first embodiment. In this case, the foregoing circuit node 21 is a supply node of power supply voltage. The discharge circuit 11 has an SCR 22 having a current path interposed between the supply node 21 of power supply voltage and a supply node of reference voltage VSS (ground voltage). In FIG. 3, the SCR 22 is shown using an equivalent circuit including the combination o a pnp type bipolar transistor 23 and an npn type bipolar transistor 24. In this case, the SCR is not always composed two bipolar transistors as shown in FIG. 3 so long as the SCR is substantially configured. The SCR 22 has an anode A, a cathode K, a first gate G1, and a second gate G2. The base of the transistor 23 is connected to the collector of the transistor 24. The collector of the transistor 23 is connected to the base of the transistor 24. A path between the emitter of the transistor 23 and the collector of the transistor 24 functions as a current path between the anode A and the cathode K of the SCR 22. The base of the transistor 23 functions as the first gate G1, and the base of the transistor 24 functions as the second gate G2.

The discharge circuit 11 further includes a diode circuit 250 and a resistor 26, in addition to the SCR 22. The diode circuit 250 is composed of at least one or a plurality of diodes 25 serial-connected in this embodiment. These diodes 25 are connected in series between the supply node 21 of power supply voltage and the anode A of the SCR 22 in such a manner that the anode side is turned toward the supply node 21 of power supply voltage. The resistor 26 is connected between the second gate G2 of the SCR 22 and the supply node of reference voltage VSS.

The trigger circuit 12A includes a diode circuit 270. The diode circuit 270 is composed of at least one or a plurality of diodes 27 (serial-connected in this embodiment) interposed between the first gate G1 of the SCR 22 and the node of reference voltage VSS. An anode of the diode circuit 270 is connected to the first gate G1 of the SCR 22.

The trigger control circuit 13 includes a P-channel MOS transistor 28 functioning as a switch element. The MOS transistor 28 has a current path between source and drain connected between a cathode of the diode circuit 270 in the trigger circuit 12A and the node of reference voltage VSS. The gate of the MOS transistor 28 is connected to a control terminal 29 supplied with control voltage Vcont. The trigger control circuit 13 further includes a gate protection circuit 30 and a resistor 31 in addition to the MOS transistor 28. The gate protection circuit 30 is provided for preventing the gate of the MOS transistor 28 from breakdown by surge voltage applied to the terminal 29. The gate protection circuit 30 includes a positive surge voltage protection circuit 32 and a negative surge voltage diode 33. The resistor 31 sets the gate of the MOS transistor 28 to a reference voltage when the control terminal 29 is potentially floating to turn on the MOS transistor 28. The resistor 31 uses high resistance such as several tens to several hundreds of MΩ.

In the ESD protection circuit device of FIG. 3, if there is a possibility that the semiconductor device is in a state of being exposed in ESD stress, that is, a state of being left, the control terminal 29 is potentially in a floating state. In this case, the MOS transistor 28 is turned on because the gate is connected to a ground voltage node via the resistor 31. Here, the number of serial-connected diodes 25 in the diode circuit 250 of the discharge circuit 11 is set as n. The number of serial-connected diodes 27 in the diode circuit 270 of the trigger circuit 12A is set as m. A forward step-down voltage of each diode is set as Vf, and an emitter-base voltage of the transistor 23 is set as Vbe(23). In this case, a trigger voltage Vtrg of the trigger circuit 12A is obtained from the following equation (1).

$$Vtrg=(n+m)*Vf+Vbe(23) \quad (1)$$

A surge voltage is applied to the supply node 21 of power supply voltage in a non operating state, and then, when the voltage exceeds the foregoing trigger voltage Vtrg, the trigger circuit 12A triggers the discharge circuit 11 to turn on the SCR 22. As a result, the surge voltage is discharged by the discharge circuit 11, and then, the surge voltage is released to the node of reference voltage VSS.

The following is a description of the case where power supply voltage is applied to a semiconductor device to operate it. In order to operate the semiconductor device, the control terminal 29 is supplied with control voltage Vcont. There are two ways to supply the control voltage Vcont. One is the case of using low breakdown voltage transistor as the MOS transistor 28 of the trigger control circuit 13. Another is the case of using a high-breakdown-voltage transistor. If a low-breakdown-voltage MOS transistor is used, the control voltage Vcont applied to the control terminal 29 is not set so high. The trigger voltage of the trigger circuit 12A when the control terminal 29 is supplied with control voltage Vcont is obtained from the following equation. In this case, the absolute value of threshold voltage of the MOS transistor 28 is set as Vth.

$$(Vtrg+Vth+Vcont)$$

The control voltage Vcont is applied, and thereby, the trigger voltage of the trigger circuit 12A steps up by (Vth+Vcont) as compared with the case where the control terminal 29 is in a floating state. In other words, the trigger voltage is freely controllable in accordance with the control voltage Vcont supplied to the control terminal 29. Moreover, the control terminal 29 is taken out as an external terminal of a semiconductor device, and thereby, the trigger voltage is controllable from the outside.

The following is a description of the case of using a high-breakdown-voltage transistor as the MOS transistor 28. If a high-breakdown-voltage transistor is used, the control terminal 29 is supplied with a voltage close to the power supply voltage supplied to the supply node 21 of power supply voltage. For example, the control terminal 29 is connected to the node 21, and then, supplied with power supply voltage supplied to the node 21 as the control voltage Vcont. As a result, the discharge circuit 11 is not triggered in any case. In other words, in this case, it is possible to inhibit a protection operation of the ESD protection circuit device. In addition, it is possible to always supply power supply voltage supplied to the supply node 21 of power supply voltage to other circuits included in the semiconductor device.

Second Example of the First Embodiment

Figure 4:
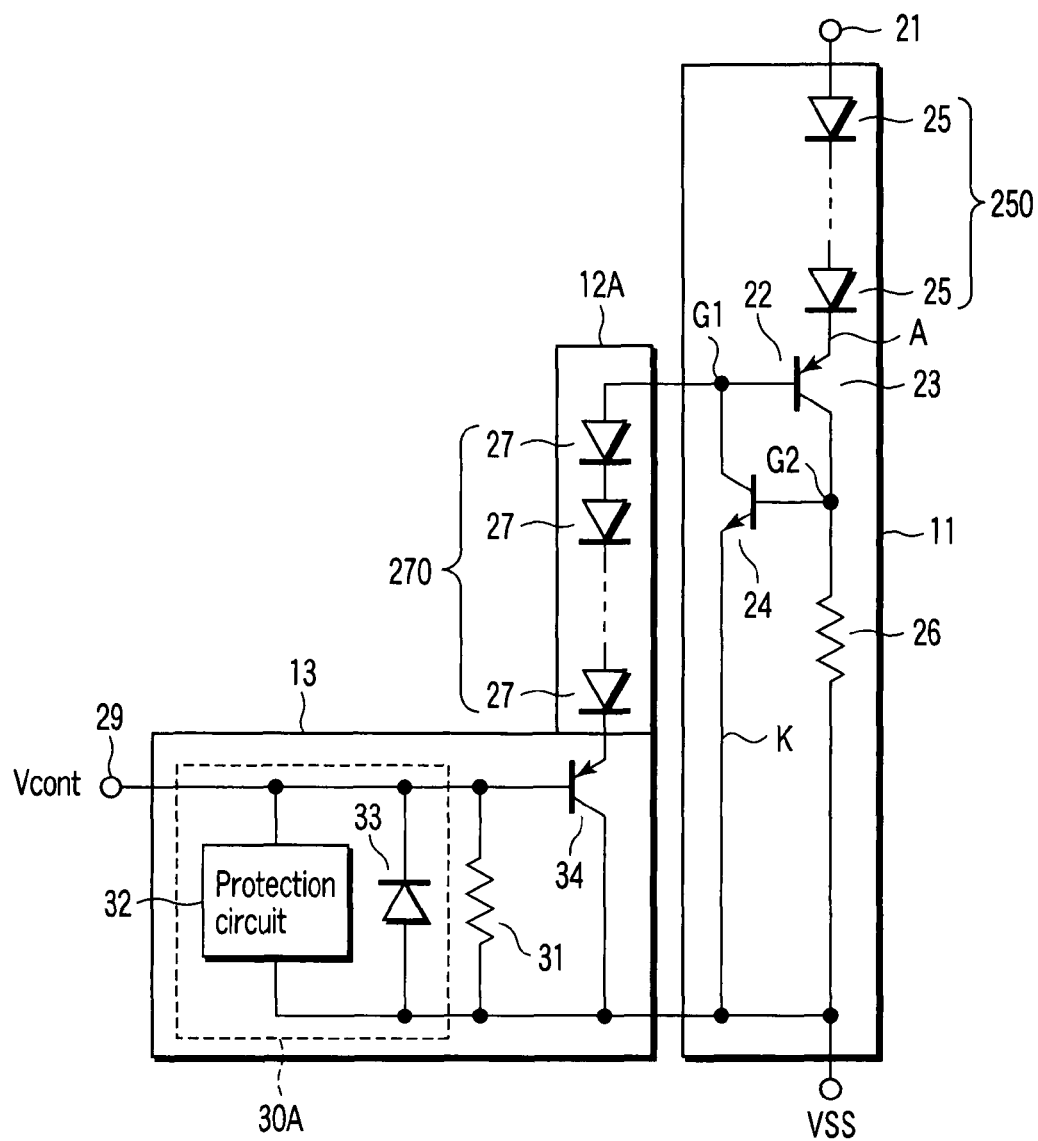
FIG. 4 is a circuit diagram showing an ESD protection circuit device according to a second example of the first embodiment.

FIG. 4 is a circuit diagram showing the configuration of an ESD protection circuit device according to a second example of the first embodiment. In the device, each configuration of the discharge circuit 11 and the trigger circuit 12A is the same as described in the ESD protection circuit device shown in FIG. 3. Part of the configuration of the trigger control circuit 13 is different. Only point different from FIG. 3 will be hereinafter described.

In the trigger control circuit 13 shown in FIG. 3, the P-channel MOS transistor 28 is used as a switch element. According to the second example, a pnp-type bipolar transistor 34 is used as a switch element. With the use of the foregoing transistor, a base protection circuit 30A is provided in place of the gate protection circuit 30. The base protection circuit 30A is provided for preventing the bipolar transistor 34 from breakdown by surge voltage applied to the terminal 29. The base protection circuit 30A is composed of a positive voltage surge protection circuit 32 and a negative voltage surge diode 33.

According to the second example, a trigger voltage of the trigger circuit 12A when the control terminal 29 is supplied with control voltage Vcont is obtained from the following equation. In this case, an emitter-base voltage of the bipolar transistor 34 is set as Vbe(34)

$$(Vtrg+Vbe(34)+Vcont)$$

Also in this example, the trigger voltage is freely controllable in accordance with the control voltage Vcont supplied to the control terminal 29.

In general, the bipolar transistor is easily made into high breakdown voltage as compared with the MOS transistor. In particular, this is preferable in the case of inhibiting a protection operation by the ESD protection circuit device.

Example of the Second Embodiment

Figure 5:
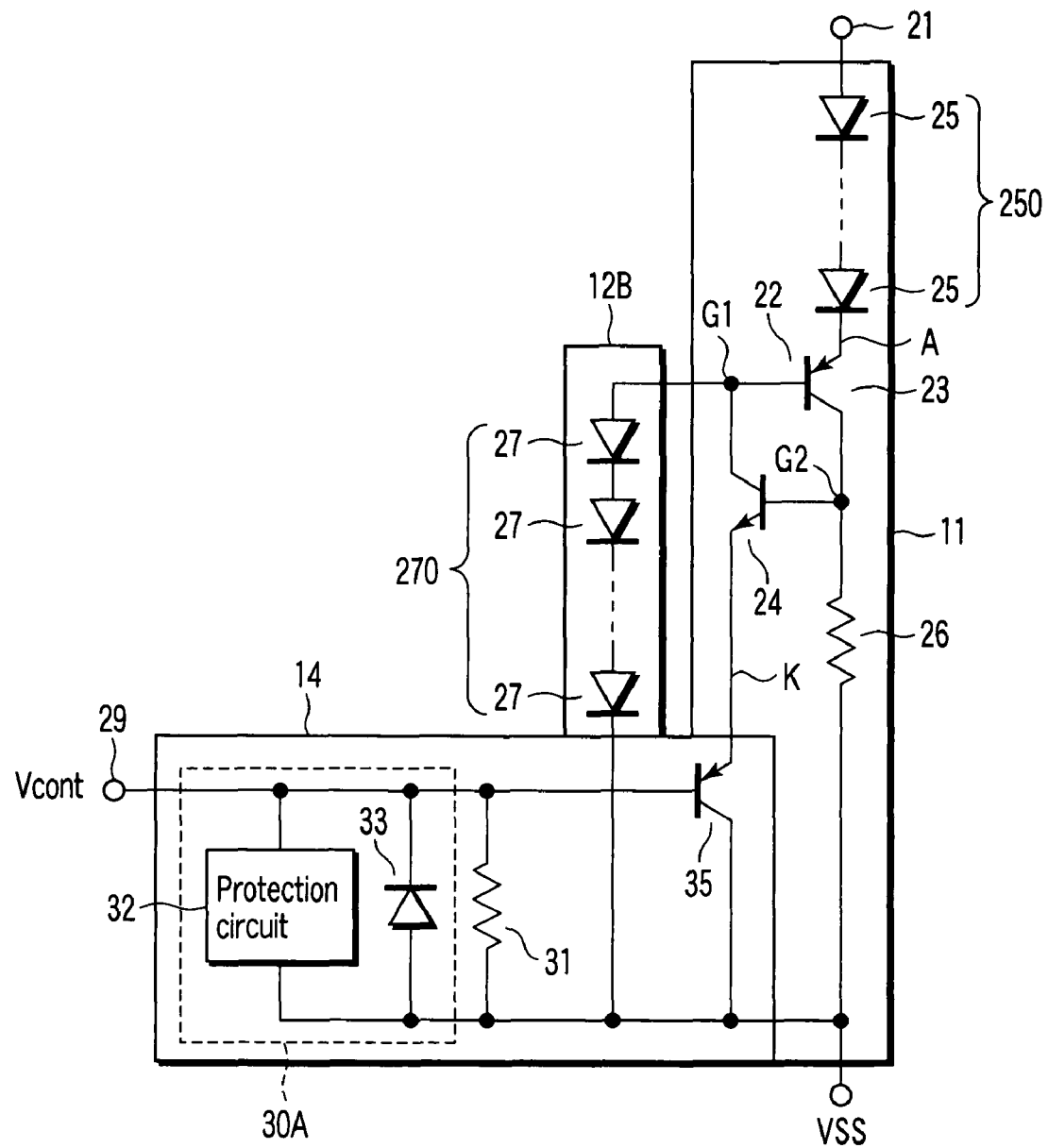
FIG. 5 is a circuit diagram showing an ESD protection circuit device according to an example of the second embodiment.

FIG. 5 is a circuit diagram showing the configuration of an ESD protection circuit device according to an example of the second embodiment. A discharge circuit 11 includes an SCR 22 having the following configuration. The SCR has a current path interposed between an anode A and a cathode K between a predetermined circuit node of a semiconductor device, for example, a supply node 21 of power supply voltage and a supply node of reference voltage VSS (ground voltage). Like FIG. 3 and FIG. 4, the SCR 22 is shown by an equivalent circuit including a pnp-type bipolar transistor 23 and an npn-type bipolar transistor 24. In this case, the SCR may not be composed using two bipolar transistors shown in FIG. 5 so long as the SCR is substantially configured. Like FIG. 3 and FIG. 4, the discharge circuit 11 includes a diode circuit 250 and a resistor 26 in addition to the SCR 22.

A trigger circuit 12B includes a diode circuit 270 like the case of FIG. 3 and FIG. 4. However, the diode circuit 270 is connected between a first gate G1 of the SCR 22 and a node of reference voltage SS, unlike FIG. 3 and FIG. 4.

A discharge control circuit 14 includes a pnp-type bipolar transistor 35 having an emitter-collector current path inserted in series with respect to the current path between the anode A and the cathode K of the SCR 22 of the discharge circuit 11. Specifically, the emitter-collector current path of the bipolar transistor 35 is connected between the cathode K of the SCR 22 and the supply node of reference voltage VSS. The base of the bipolar transistor 35 is connected to a control terminal 29 supplied with control voltage Vcont. The discharge control circuit 14 further includes a base protection circuit 30A and a resistor 31 in addition to the bipolar transistor 35. The base protection circuit 30A is provided to prevent the bipolar transistor 35 from breakdown by surge voltage applied to the control terminal 29. The base protection circuit 30A is composed of a positive voltage surge protection circuit 32 and a negative voltage surge diode 33. The resistor 31 sets the base of the bipolar transistor 35 to a reference voltage when the control terminal 29 is potentially in a floating state to turn on the bipolar transistor 35.

In the ESD protection circuit device of FIG. 5, if there is a possibility that the semiconductor device is in a state of being exposed in ESD stress, that is, a non operation state, the control terminal 29 is potentially in a floating state. In this case, the bipolar transistor 35 is turned on because the base is connected to a ground voltage node via the resistor 31. Here, the number of serial-connected diodes 25 in the diode circuit 250 of the discharge circuit 11 is set as n. The number of serial-connected diodes 27 in the diode circuit 270 of the trigger circuit 12B is set as m. A forward step-down voltage of each diode is set as Vf, and an emitter-base voltage of the transistor 23 is set as Vbe(23). In this case, a trigger voltage Vtrg of the trigger circuit 12B is obtained from the following equation (2).

$$V_{trg}=(n+m)*Vf+Vbe(23) \quad (2)$$

In other words, the trigger voltage of the trigger circuit 12B is fixed to Vtrg.

A surge voltage is applied to the supply node 21 of power supply voltage in a non operation state, and then, when the voltage exceeds the foregoing trigger voltage Vtrg, the trigger circuit 12B triggers the discharge circuit 11 to turn on the SCR 22. As a result, the surge voltage is discharged by the discharge circuit 11, and then, the surge voltage is released to the node of reference voltage VSS.

The following is a description of the case of supplying a power supply voltage to a semiconductor device to operate it. When the semiconductor device is operated, there are the following two cases like FIG. 3 and FIG. 4. One is the case of changing the control voltage Vcont applied to the control terminal 29 to control a trigger voltage. Another is the case of connecting the control terminal 29 to the node 21 to inhibit a protection operation as the ESD protection circuit.

In the latter case, the control terminal 29 is connected to the node 21 to supply power supply voltage supplied to the node as control voltage Vcont. By doing so, the bipolar transistor 35 of the discharge control circuit 14 does not turn on in any cases, and also, the bipolar transistors 24 forming the SCR 22 does not turn on in any cases. Thus, the discharge control circuit 14 inhibits a discharge operation by the discharge circuit 11 regardless of the trigger voltage of the trigger circuit 12B. In other words, in this case, it is possible to inhibit a protection operation of the ESD protection circuit. Moreover, it is possible to always supply power supply voltage supplied to the supply node 21 of power supply voltage to other circuits included in the semiconductor device.

In the former case, surge voltage is applied to the node 21, and thereafter, when voltage exceeds a trigger voltage of the trigger circuit 12B, the discharge circuit 11 is triggered. However, whether or not the discharge circuit 11 starts a discharge operation determines according to the control voltage Vcont supplied to the control terminals 29. In this case, a trigger voltage Vtrg when the discharge circuit 11 starts a discharge operation is obtained from the following equation (3) assuming that collector-emitter voltage is set as 0 when the transistor 24 is in an on state.

$$V_{trg}=Vb(22)+Vbe(35)+Vcont \quad (3)$$

In the foregoing equation, Vb(22) is base voltage of the transistor 22, and Vbe(35) is base-emitter voltage of the transistor 35. Vb(22) is obtained from the following equation (4) when voltage of the node 21 is set as V(21).

$$Vb(22)=m*Vf(n*Vf+Vbe(23)+m*Vf)*V(21) \quad (4)$$

When Vb(22) expressed in the equation (4) is substituted for the equation (3), the following equation (5).

$$V_{trg}=m*Vf(n*Vf+Vbe(23)+m*Vf)*V(21)+Vbe(35)+Vcont \quad (5)$$

Namely, the trigger voltage Vtrg is freely controlled in accordance with the control voltage Vcont supplied to the control terminal 29. The control terminal 29 is taken out as an external terminal of a semiconductor device, and thereby, the trigger voltage is controllable externally.

Figure 6:
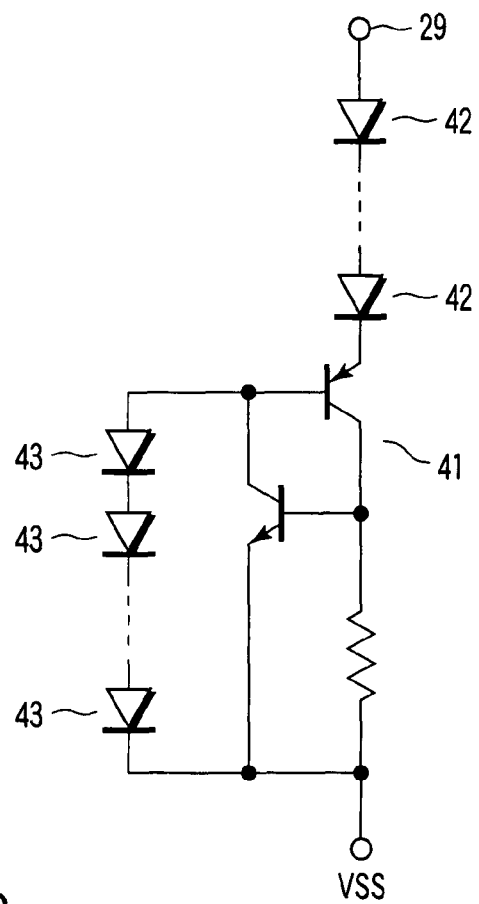
FIG. 6 is a circuit diagram showing the configuration of the protection circuit shown in FIG. 3, FIG. 4 and FIG. 5.

FIG. 6 is a circuit diagram showing the configuration of the gate protection circuit 30 shown in FIG. 3 and FIG. 4 or the protection circuit as the base protection circuit 30A shown in FIG. 5. These protection circuits may be any configured so long as they have a function of releasing surge when positive voltage surge is applied to the control terminal 29. FIG. 6 shows one example of the protection circuit, for example, described in the foregoing PCT National Publication 2004-531055. Specifically, the protection circuit is composed of an SCR 41, some diodes 42 and some diodes 43. These diodes 42 are connected in series between the control terminal 29 and an anode of the SCR 41. These diodes 43 are connected in series between the gate of the SCR 41 and a node of ground voltage VSS.

The protection circuit is operated in the following manner. Specifically, when surge is applied to the control terminal 29, the voltage of the control terminal 29 exceeds a trigger voltage determined by forward step-down voltage of diodes 42 and 43, that is, the emitter-base voltage of the bipolar transistor forming the SCR 41, the SCR turns on to release surge.

Application Example

An application example of the present invention will be hereinafter described.

Figure 7:
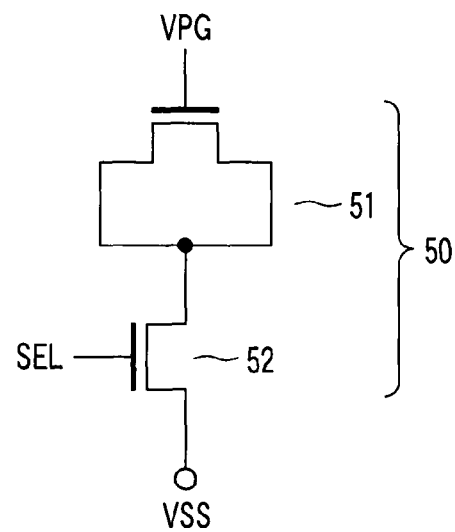
FIG. 7 is a circuit diagram showing the configuration of an irreversible change circuit.

In a semiconductor device, an irreversible change circuit is used for purpose of changing circuit settings after manufactured. FIG. 7 is a circuit diagram showing the configuration of an irreversible change circuit 50. In FIG. 7, 51 denotes an irreversible change element including a MOS transistor, and 52 denotes a switch MOS transistor for selecting the irreversible change element. In programming, the gate of the irreversible change element 51 is supplied with high-voltage program voltage VPG. When the gate of the switch MOS transistor 52 connected to the irreversible change element 51 to be selected is supplied with a select signal SEL, program voltage VPG is applied between the gate of the irreversible change element 51 and a substrate. For this reason, the gate of the irreversible change element 51 is broken down. In a data read operation from the irreversible element 51, gate breakdown/non-breakdown states are read as binary data such as "1"/"0", and thus, used as setting change data after the semiconductor device is manufactured.

Figure 8:
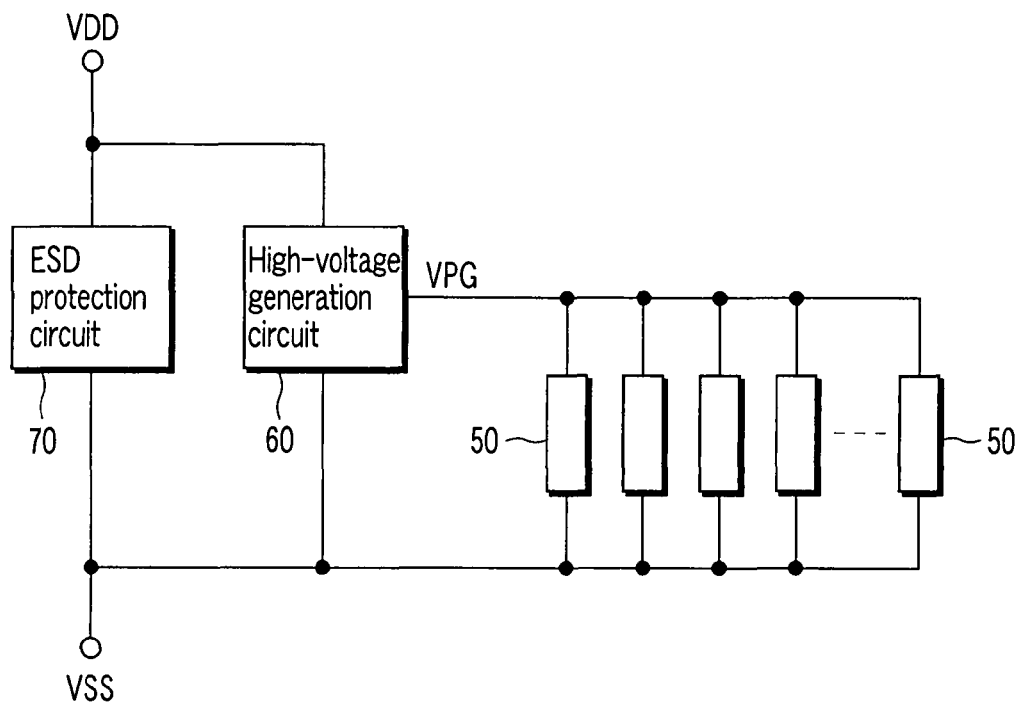
FIG. 8 is a circuit diagram showing the configuration of a program circuit device using a high-voltage generation circuit.

As described above, there is a need of supplying high-voltage program voltage VPG to the irreversible change element in programming. The program voltage VPG is usually generated using a high-voltage generation circuit 60 shown in FIG. 8. In other words, FIG. 8 shows one example of a programming circuit using the high-voltage generation circuit. A high-voltage generation circuit 60 steps up power supply voltage VDD to generate program voltage VPG. The program voltage VPG is supplied to many irreversible change circuits 50. In order to protect the high-voltage generation circuit 60 and the irreversible change circuits 50 from surge applied to a terminal of power supply voltage VDD, an ESD protection circuit 70 is connected to the terminal of power supply voltage VDD. The ESD protection circuit 70 is a conventional type having a fixed trigger voltage starting a protection operation.

If an integrated circuit is formed, the high-voltage generation circuit 60 of FIG. 8 occupies a very large area. A program state of the irreversible change element largely varies according to characteristic variations of the high-voltage generation circuit 60. Therefore, preferably, the high-voltage generation circuit 60 is not used as possible as can. In order to solve the foregoing problem, the following matter is considered. Specifically, the high-voltage generation circuit 60 is removed from the configuration of FIG. 8. The program voltage is directly supplied to the ESD protection circuit 70 and several irreversible change circuits 50 in place of power supply voltage VDD. By doing so, the following new problem arises.

When supplied with high-voltage program voltage VPG, the gate is broken down in the irreversible change element of the irreversible change circuit 50; as a result, the breakdown is programmed. Therefore, when programming is made in a normal operation, the program voltage VPG must be supplied to a power terminal. Conversely, surge voltage more than VPG is applied to the power terminal in a non operating state. Therefore, the ESD protection circuit 70 needs to set the trigger voltage lower. However, if the trigger voltage is set lower than the program voltage, the ESD protection circuit 70 is triggered before the program voltage VPG is applied to the irreversible change element, and then, a protection operation by the ESD protection circuit 70 is started. Thus, the irreversible change element is not programmed. In particular, if the program voltage VPG is selectable in a certain range, there is a high possibility that programming is not made. Therefore, if the conventional type ESD protection circuit is used, the following problem arises. Namely, it is impossible both to protect the irreversible change element and to supply the program voltage VPG to the irreversible change element in programming. Therefore, the high-voltage generation circuit is necessarily required.

Figure 9:
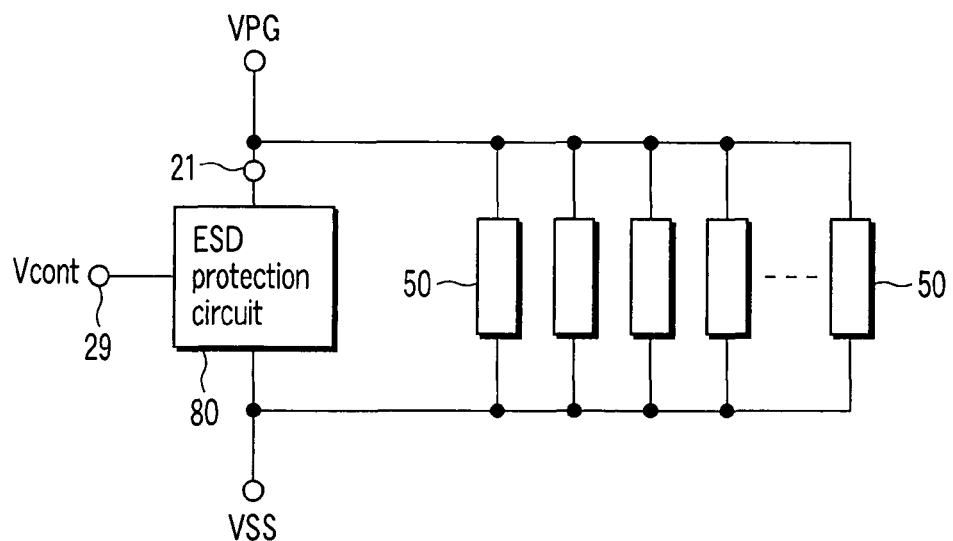
FIG. 9 is a circuit diagram showing the configuration of a programming circuit device according to an application example of the present invention.

On the contrary, FIG. 9 is a block diagram showing the configuration of an application example of using the ESD protection circuit device of the present invention to protect the irreversible change element. Each irreversible change circuit 50 includes an irreversible change element 51 composing a MOS transistor and a switch MOS transistor 52. An ESD protection circuit device 80 uses the ESD protection circuit device of the first or second embodiment capable of controlling the trigger voltage in accordance with control voltage Vcont supplied to the control terminal 29, as described before. A supply node 21 of power supply voltage of the ESD protection circuit device 80 is connected to a power terminal supplied with program voltage VPG when the irreversible change circuit 50 is programmed.

When the circuit of FIG. 9 is in a non operating state, surge voltage is applied to the power terminal supplied with program voltage VPG. If the voltage exceeds the trigger voltage of the ESD protection circuit device 80, the ESD protection circuit device starts a protection operation. The surge voltage applied to the power terminal supplied with VPG is released to the node of ground voltage VSS via the ESD protection circuit device 80.

Conversely, if the program voltage VPG is supplied to the circuit to program the irreversible change circuit 50, the control terminal 29 is connected to the node 21 so that voltage supplied to the node 21 is supplied as control voltage Vcont. In this way, as described before, it is possible to inhibit a protection operation by the ESD protection circuit device. Moreover, it is possible to supply the program voltage VPG to the irreversible change circuit 50.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electrostatic discharge protection circuit device comprising:
    a discharge circuit connected to a predetermined circuit node of a semiconductor device, and discharging the circuit node when surge voltage is applied to the circuit node, the discharge circuit including a silicon controlled rectifier having an anode, a cathode, a first gate and a second gate, and a current path between the anode and the cathode interposed between the circuit node and a supply node of reference voltage;
    a trigger circuit connected to the discharge circuit, and triggering the discharge circuit to start a discharge operation of the discharge circuit, the trigger circuit including a first diode circuit having at least one diode, and an anode of the first diode circuit is connected to the first gate of the silicon controlled rectifier; and
    a trigger control circuit having an input terminal and an output terminal, the output terminal being connected to the trigger circuit, the trigger control circuit including a switch element having a current path and a control electrode, the current path being interposed between the cathode of the first diode circuit and the supply node of reference voltage, and the control electrode being connected to the input terminal and supplied with a control voltage,
    wherein, when the input terminal is floating, the discharge circuit discharges at the surge voltage applied to the circuit node, and when the input terminal is applied with a predetermined control voltage, the trigger, control circuit controls a trigger voltage and is capable of controlling the trigger voltage to prevent the discharge circuit from discharging, the trigger voltage being a voltage at which the trigger circuit starts the discharge operation of the discharge circuit.

2. The device according to claim 1, wherein the circuit node is a power supply voltage node.

3. The device according to claim 1, wherein the discharge circuit further includes a second diode circuit having at least one diode, and an anode of the second diode circuit is connected to the circuit node while a cathode thereof is connected to the anode of the silicon controlled rectifier.

4. The device according to claim 1, wherein the discharge circuit further includes a first resistor connected between the second gate of the silicon controlled rectifier and the supply node of reference voltage.

5. The device according to claim 1, wherein the trigger control circuit further includes a second resistor connected between the control electrode of the switch element and the supply node of reference voltage.

6. The device according to claim 1, wherein the switch element is a P-channel MOS transistor.

* * * * *